(12) United States Patent
Sato

(10) Patent No.: US 8,710,644 B2
(45) Date of Patent: Apr. 29, 2014

(54) SEMICONDUCTOR UNIT HAVING A POWER SEMICONDUCTOR AND SEMICONDUCTOR APPARATUS USING THE SAME

(75) Inventor: Kenichiro Sato, Shiojiri (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/108,179

(22) Filed: May 16, 2011

(65) Prior Publication Data

US 2011/0278643 A1 Nov. 17, 2011

(30) Foreign Application Priority Data

May 17, 2010 (JP) .................................. 2010-113183

(51) Int. Cl.
- *H01L 23/48* (2006.01)
- *H01L 23/52* (2006.01)
- *H01L 23/10* (2006.01)
- *H01L 23/34* (2006.01)
- *H01L 23/40* (2006.01)

(52) U.S. Cl.
USPC ........... 257/692; 257/140; 257/686; 257/687; 257/690; 257/693; 257/696; 257/706; 257/720; 257/723; 257/726; 257/727; 257/773; 257/784; 257/E23.01; 257/E29.197

(58) Field of Classification Search
None
See application file for complete search history.

(56) References Cited

U.S. PATENT DOCUMENTS

| | | | |
|---|---|---|---|
| 6,703,707 B1 * | 3/2004 | Mamitsu et al. ............... | 257/718 |
| 7,494,389 B1 * | 2/2009 | Essert et al. ................... | 439/884 |
| 2006/0096299 A1 * | 5/2006 | Mamitsu et al. ................. | 62/3.2 |
| 2011/0024896 A1 * | 2/2011 | Tsunoda et al. ............... | 257/707 |

FOREIGN PATENT DOCUMENTS

| | | | | |
|---|---|---|---|---|
| JP | 2000-156439 A | 6/2000 | | |
| JP | 2005-073373 A | 3/2005 | | |
| WO | WO 2010/004609 A1 * | 1/2010 | ............. | H01L 23/48 |

* cited by examiner

*Primary Examiner* — Michael Jung
(74) *Attorney, Agent, or Firm* — Rossi, Kimms & McDowell, LLP

(57) ABSTRACT

A semiconductor unit of certain aspects of the invention includes electrically conductive plates in the shape of the letter L, each consisting of a horizontally disposed leg portion and a vertically disposed flat body portion that is perpendicular to a cooling plate adhered to the bottom of the semiconductor unit. A pair of the vertically disposed flat body portions sandwiches a semiconductor chip. Owing to this construction, the heat generated in the semiconductor chip can be conducted away through the both surfaces of the chip, thus improving cooling performance. Since the heat is conducted away through the leg portions of the L-shaped electrically conductive plates a projected planar area occupied by the cooling plate required for cooling the semiconductor unit is reduced. Therefore, the size of the semiconductor unit can be reduced.

11 Claims, 19 Drawing Sheets

SEMICONDUCTOR UNIT HAVING A POWER SEMICONDUCTOR AND SEMICONDUCTOR APPARATUS USING THE SAME

BACKGROUND OF THE INVENTION

1. Field of the Invention

The present invention relates to a semiconductor unit containing a semiconductor chip, and a semiconductor apparatus using the semiconductor unit.

2. Description of the Related Art

It is known, for example in Japanese Unexamined Patent Application Publication No. 2000-156439 (see FIG. 1), referred to herein as "Patent Document 1," to construct a semiconductor module, in a package, containing power semiconductor elements such as an IGBT (an insulated gate bipolar transistor), a FWD (a free-wheeling diode) and the like mounted on an insulated substrate.

FIG. 17 is a sectional view of an essential part of a semiconductor module of a first conventional example. FIG. 17 shows a semiconductor module similar to that disclosed in Patent Document 1.

Referring to FIG. 17, an insulated substrate 55 is joined onto a cooling plate 54 with a solder or the like, and an IGBT chip 56 is mounted on the cooling plate 54 through the insulated substrate 55. A collector electrode 58 of the IGBT chip 56 is electrically connected to a metal thin plate 55a on the insulated substrate 55 with an electrically conductive material such as a solder or the like.

An external electrode terminal 62 for a collector is electrically connected to a metal thin plate 64b of a junction substrate 63b joined onto the cooling plate 54 with a solder or the like through a bus bar 60 for the collector. An aluminum wire 65 makes electrical connection between the collector electrode 58 of the IGBT chip 56 and the metal thin plate 64b of the junction substrate 63b.

On the other hand, an external electrode terminal 61 for an emitter is electrically connected to a metal thin plate 55b of the insulated substrate 55 joined on the cooling plate 54 with a solder or the like, through a bus bar 59 for the emitter. A cooling member 67 of metal is joined to an emitter electrode 57 of the IGBT chip 56 through an electrically conductive junction member 66, and then, joined to a metal thin plate 64a of a junction substrate 63a with a solder or the like.

As a result, the emitter electrode 57 is electrically connected to the metal thin plate 64a of the junction substrate 63a through the cooling member 67, and then, electrically connected to the external electrode terminal 61 for the emitter through the bus bar 59 for the emitter. The reference numeral 68 represents a casing for containing the IGBT chip 56, and the reference numeral 69 represents silicone gel that seals off the contained members in the casing 68.

In this semiconductor module, the cooling member 67 composed of metal plates makes conjunction between the emitter electrode 57 on the upper surface of the IGBT chip 56 and the insulative junction substrate 63a disposed on the cooling plate 54. Consequently, the heat generated in the IGBT chip 56 is withdrawn from both upper and lower surfaces of the IGBT chip to the cooling plate 54.

Japanese Unexamined Patent Application Publication No. 2005-073373 (see FIG. 1), referred to herein as "Patent Document 2," discloses a semiconductor module of a second conventional example used in a power conversion apparatus. This power conversion apparatus comprises: a semiconductor module containing semiconductor elements and having main electrode terminals and control electrode terminals; a control circuit board connected to the control terminal electrodes of the semiconductor module; a bus bar assembly composed of a plurality of bus bars connected to the main electrode terminals of the semiconductor modules; and a plurality of cooling tubes for cooling the semiconductor module from the both surfaces of the semiconductor module. The cooling structure for the semiconductor module of the power conversion apparatus has cooling bodies sandwiching the semiconductor module and cooling the semiconductor module from the both surfaces thereof.

In the first conventional example, the emitter electrode 57 on the upper surface of the IGBT chip 56 and the insulative junction substrate 63a provided on the cooling plate 54 are joined with the cooling member 67 composed of metal plates. The heat generated in the IGBT chip 56 is transported through the cooling member 67 and the insulative junction substrate 63a to the cooling plate 54. Consequently, a certain area is required as shown by the symbol 'A' in FIG. 18, for joining the cooling member 67 with the insulation junction substrate 63a (indicated in FIG. 17). This requirement for ensuring the heat transfer area raises a problem of increase in a module size.

An aluminum wire is used for connecting the collector electrode and the lead out terminal. The distance indicated by the arrow 'B' in FIG. 18 is required between the two places connected by the aluminum wire in order to avoid stress development in the wire and at the joints. This requirement for ensuring the distance raises a problem of increase in a module size.

A current density of the main current that runs in the aluminum wire can be hardly increased. In order to ensure sufficient magnitude of electric current capacity, the number of aluminum wires needs to be increased, which however, increases the number of wiring places of the wires and the number of manufacturing steps. In addition, need for reserving a region to connect a multiple of aluminum wires raises a problem of an enlarged module size.

Moreover, the apparatus is provided with a control pin block (not depicted in the figure) on a side wall surface of the casing, the control pin block being required for inputting control signals to control the IGBT chip 56. Need for an area to dispose the block makes minimization of the module difficult.

Patent Document 2 does not describe an internal structure of the semiconductor module. The semiconductor elements cannot be practically used without providing appropriate cooling bodies on the both surfaces of the semiconductor element. Thus, a power conversion apparatus, for example, a three phase inverter, using the semiconductor elements is enlarged.

Patent Document 1 and Patent Document 2 do not mention such a structure that a pair of electrically conductive plates sandwiches the semiconductor element from the both surfaces thereof and a leg portion of the electrically conductive plate bent in the shape of the letter 'L' is attached to a heat sink to cool the semiconductor element, and the structure is molded with a resin.

SUMMARY OF THE INVENTION

In view of the above-described problems, it is an object of embodiments of the present invention to solve the above-problems and provide a semiconductor unit in a small size exhibiting good cooling performance. Another object of the invention is to provide a semiconductor apparatus using such a semiconductor unit.

In order to accomplish the objects, a semiconductor unit according to the invention comprises: electrically conductive plates in the shape of the letter L having a flat body portion and a leg portion perpendicular to the flat body portion; a pair (s) of a semiconductor chip and a spacer that are laminated and fixed with each other, the pair being sandwiched by the flat body portions of two of the electrically conductive plates disposed opposing with each other; control terminals, one side ends of which are connected to control electrodes of the semiconductor chip; and resin that seals off the flat body portions of the electrically conductive plates, the spacer, the semiconductor chip, and the one side ends of the control terminals; wherein the leg portions of the electrically conductive plates and the other ends of the control terminals are projecting out of the resin.

A semiconductor apparatus according to embodiments of the invention comprises: the semiconductor unit as defined above; lead out terminals each connected to the leg portion of the semiconductor unit; a cooling plate to which lower surfaces of the leg portions of the semiconductor unit or lower surfaces of the lead out terminals are fixed interposing an insulation layer; a casing fixed to the cooling plate and containing the semiconductor unit and the lead out terminals, ends of the lead out terminals and ends of the control terminals being projecting out of the casing; and insulation material put in the casing.

According to an embodiment of the invention, in the semiconductor apparatus described above, preferably the lead out terminal is connected to the leg portion of the semiconductor unit through an internal connection conductor.

A semiconductor apparatus according to embodiments of the invention comprises: a plurality of the semiconductor units as described above; a wiring conductor(s) connecting the leg portions of a plurality of the semiconductor units; lead out terminals each connected to the leg portion of the plurality of the semiconductor units; a cooling plate to which at least one of a lower surface of the leg portion, a lower surface of the wiring conductor, and a lower surface of the lead out terminal are fixed interposing an insulation layer; a casing fixed to the cooling plate and containing the semiconductor unit, the wiring conductors, and the lead out terminals, ends of the lead out terminals and ends of the control terminals being projecting out of the casing; and insulation material put in the casing.

According to an embodiment of the invention, in the semiconductor apparatus described above, preferably the lead out terminal is connected to the leg portion of the semiconductor unit or the wiring conductor through an internal connection conductor.

According to an embodiment of the invention, in the semiconductor apparatus described above, preferably a part of the wiring conductor extends to project out and lead out from the casing.

According to an embodiment of the invention, the semiconductor apparatus as described above preferably further comprises a drive circuit board disposed above the casing and connected to the control terminals of the semiconductor unit.

According to an embodiment of the invention, the semiconductor apparatus described above preferably further comprises: a lid covering the casing at the top thereof; a drive circuit board that is disposed inside the casing, immersed in the insulation material, and connected to the control terminals of the semiconductor unit; and control conductors that are fixed to the drive circuit board and projecting out through the lid.

According to an embodiment of the invention, in the semiconductor apparatus as described above, preferably the insulation material is gel.

According to an embodiment of the invention, in the semiconductor unit described above, the semiconductor chips are preferably an IGBT chip and a FWD chip connected in antiparallel to the IGBT chip.

According to an embodiment of, in the semiconductor apparatus as described above, the lead out terminals are one of a P terminal, an N terminal, and an M terminal that are components of an inverter.

According to an embodiment of the invention, in the semiconductor apparatus as described above, the lead out terminals are preferably disposed separating vertically in the casing.

According to an embodiment of the invention, in the semiconductor apparatus as described above, the lead out terminals are preferably fixed to the leg portion of the semiconductor unit by means of laser welding.

According to an embodiment of the invention, in the semiconductor apparatus as described above, the leg portions of the semiconductor unit are preferably fixed to the lead out terminal and the wiring conductor by means of laser welding.

A semiconductor unit of embodiments of the present invention comprises a pair of electrically conductive plates each having the shape of the letter 'L' and consisting of a vertical flat body portion and a horizontal leg portion. The flat body portions are disposed perpendicularly to a cooling plate adhered to the bottom of the semiconductor unit. A pair of the vertically disposed flat body portions sandwiches the semiconductor chip. Owing to this construction, the heat generated in the semiconductor chip is conducted away through the both surfaces of the chip and through the electrically conductive plates. Therefore, cooling performance of a semiconductor apparatus is improved using such a semiconductor unit.

The pair of vertical flat body portions of the electrically conductive plates sandwich the semiconductor chip and the horizontal leg portions conduct away the heat to the cooling plate. Therefore, a projected planar area of the cooling plate required for cooling the semiconductor unit is reduced, resulting in a reduced size of a semiconductor apparatus using the semiconductor unit.

When the cooling plate is replaced by a heat sink, the cooling efficiency is further improved.

The main electric current in the semiconductor chip is lead to run through the electrically conductive plates. Consequently, the semiconductor apparatus can handle a heavy current.

A semiconductor apparatus that is a small sized power semiconductor module of a type of power conversion apparatus is readily constructed using several units of the semiconductor unit of the invention.

BRIEF DESCRIPTION OF DRAWINGS

FIGS. 1(a) through 1(e) are external views of a semiconductor unit 100 of Example 1 according to embodiments of the present invention, in which FIG. 1(a) is a front view, FIG. 1(b) is a left side view, FIG. 1(c) is a right side view, FIG. 1(d) is a top plan view, and FIG. 1(e) is a bottom plan view;

FIG. 14(a) and FIG. 14(b) are equivalent circuit diagrams of a semiconductor apparatus applying the embodiments of present invention, in which FIG. 14(a) shows an equivalent circuit of two series-connected semiconductor units 100 and FIG. 14(b) shows an equivalent circuit of two parallel-connected semiconductor units 100.

FIGS. 15(a) and 15(b) show a construction of a semiconductor apparatus 1100 of Example 11 according to the present invention, in which FIG. 15(a) is a plan view of an essential part and FIG. 15(b) is a sectional view of the essential part cut along the line Y-Y in FIG. 15(a);

FIGS. 16(a) and 16(b) show a construction of a semiconductor apparatus 1200 of Example 12 according to the present invention, in which FIG. 16(a) is a plan view of an essential part and FIG. 16(b) is a sectional view of the essential part cut along the line X-X in FIG. 16(a);

FIGS. 19(a) and 19(b) are perspective views of a pair of electrically conductive plates, in which FIG. 19(a) shows the leg portions extending towards both opposite outsides, and FIG. 19(b) shows the leg portions extending towards one and the same side.

DETAILED DESCRIPTION OF THE INVENTION

Some aspects of preferred embodiments will be described showing some examples of embodiment.

Example 1

FIGS. 1(a) through 1(e) are external views of a semiconductor unit 100 of Example 1 according to embodiments of the present invention, in which FIG. 1(a) is a front view, FIG. 1(b) is a left side view, FIG. 1(c) is a right side view, FIG. 1(d) is a top plan view, and FIG. 1(e) is a bottom plan view.

Figure 1:
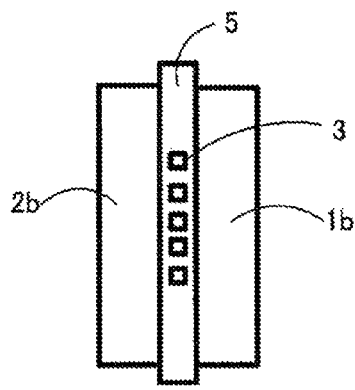
Figure 1:
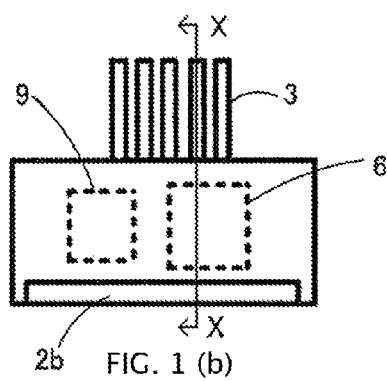
Figure 1:
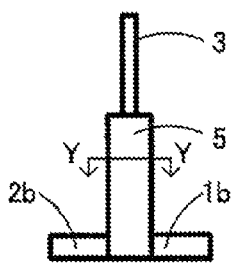
Figure 1:
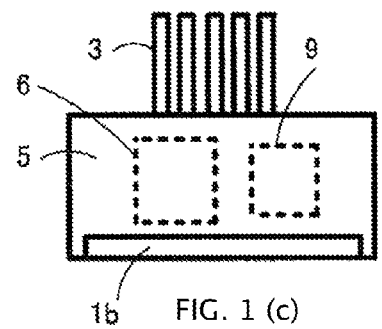
Figure 1:
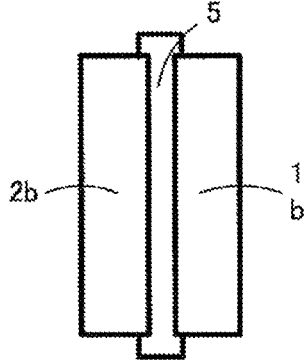
Figure 2:
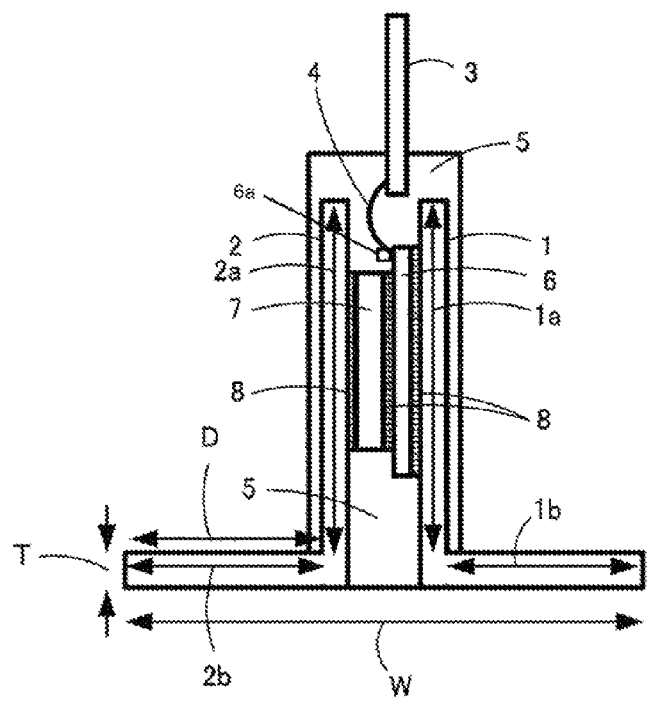
FIGS. 2(a) and 2(b) are sectional views of an essential part of the semiconductor unit 100 of FIGS. 1(a) through 1(e)
Figure 2:
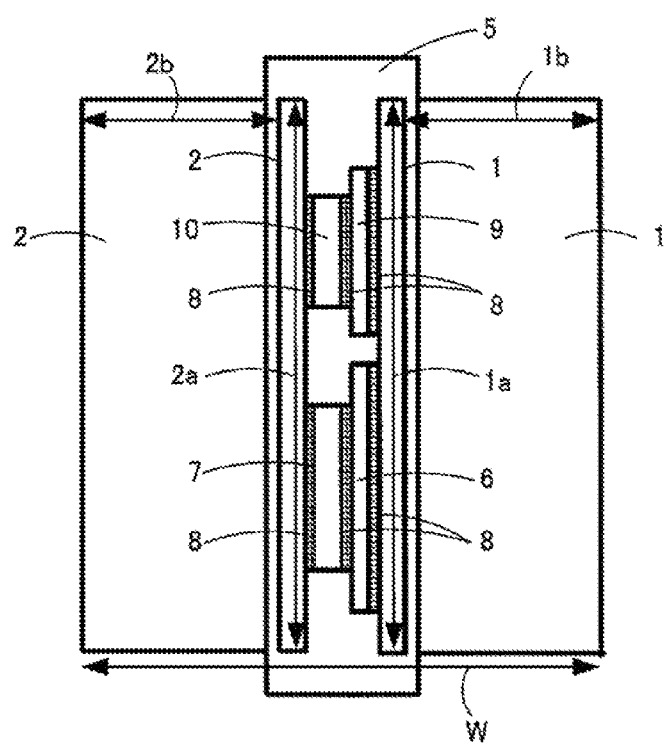

FIGS. 2(a) and 2(b) are sectional views of the semiconductor unit 100 of FIGS. 1(a) through 1(e), in which FIG. 2(a) is a sectional view cut along the line X-X in FIG. 1(b) and FIG. 2(b) is a sectional view cut along the line Y-Y in FIG. 1(a).

This semiconductor unit 100 comprises a pair of electrically conductive plates in the shape of the letter L. The electrically conductive plate consists of a flat body portion and a leg portion that is continuous and perpendicular to the flat body portion. An undepicted collector electrode of an IGBT chip 6 is soldered to an L-shaped electrically conductive plate 1 for collector with a solder 8. An L-shaped electrically conductive plate 2 for emitter is soldered with a solder 8 to one surface of a spacer 7, the other surface of which is soldered with a solder 8 to an undepicted emitter electrode of the IGBT chip 6.

The electrically conductive plate 1 for collector is also soldered with a solder 8 to an undepicted cathode electrode of a FWD 9, which is disposed adjacent to the IGBT chip 6. The electrically conductive plate 2 is also soldered with a solder 8 to one surface of a spacer 10, the other surface of which is soldered with a solder 8 to an undepicted anode electrode of the FWD chip 9.

Control electrodes of the IGBT 6 are connected to control terminals 3 with wires 4. These components are sealed off with resin 5 to construct the semiconductor unit 100.

The electrically conductive plate 1 for collector in the shape of the letter L and the electrically conductive plate 2 for emitter in the shape of the letter L consist of flat body portions 1a, 2a sandwiching the IGBT chip 6 and the FWD chip 9, and the leg portions 1b, 2b leading externally. The leg portion 1b, 2b is continued to the edge of the flat body portion 1a, 2a and perpendicular to the flat body portion 1a, 2a. The leg portions 1b, 2b are protruding out of the resin 5.

The leg portions 1b, 2b of the semiconductor unit 100 are attached to an undepicted circuit board for packaging. Consequently, the semiconductor unit 100 is electrically connected to the undepicted circuit board through the leg portions 1b, 2b, and the heat generated in the IGBT chip 6 and the FWD chip 9 is conducted to an undepicted cooling plate or cooling fins through the leg portions 1b, 2b.

The control terminals 3 include a gate terminal, an auxiliary emitter terminal, a temperature sensor terminal, and a current detection terminal. Some of the control terminals 3 are connected to control electrodes 6a (see FIG. 2(a)) of the IGBT chip 6 through the wire 4 and are fixed with the resin 5. Every control terminal 3 is projecting out of the resin 5.

Thicknesses T of the L-shaped electrically conductive plate 1 for collector and the L-shaped electrically conductive plate 2 for emitter are in the range of 1 mm to 5 mm. A length of the leg portions is in the range of 1 cm to 2 cm.

The solder 8 can be an electrically conductive adhesive such as silver paste.

The L-shaped electrically conductive plate 1 for collector, the L-shaped electrically conductive plate 2 for emitter, and the control terminals 3 are often formed using a lead frame.

Figure 17:
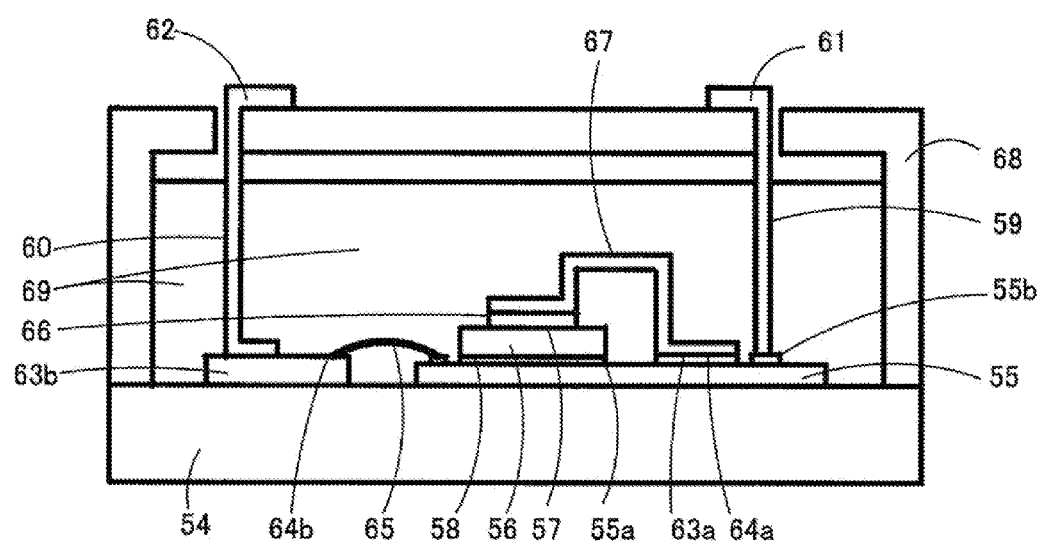
FIG. 17 is a sectional view of an essential part of a semiconductor module of a first conventional example.
Figure 18:
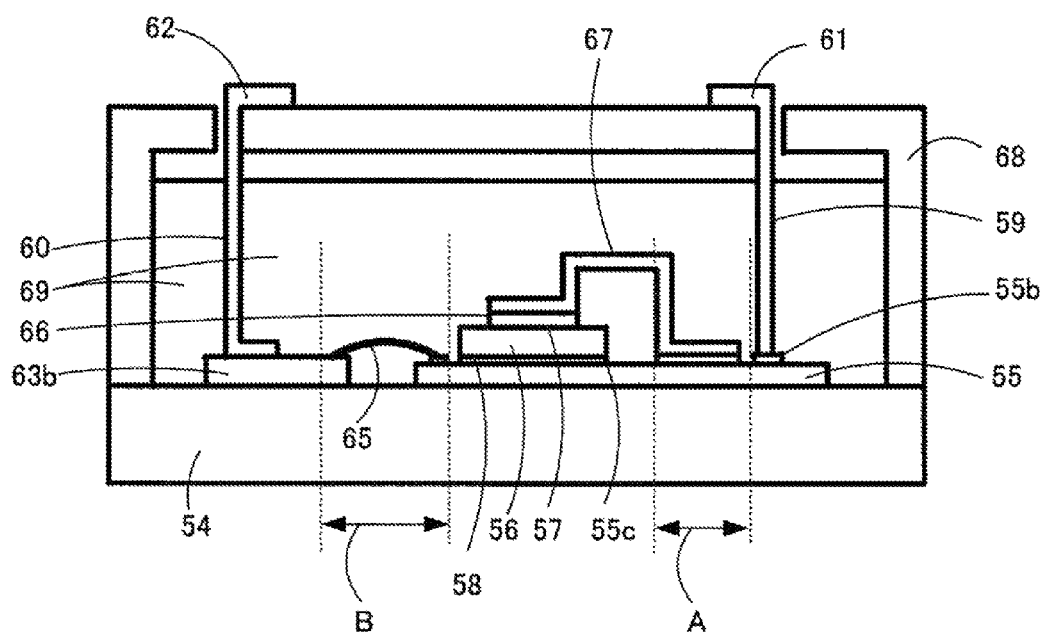
FIG. 18 illustrates disadvantages of the conventional semiconductor module of FIG. 17.

The IGBT chip 6 and the FWD chip 9 have a flat configuration and the flat surfaces are disposed vertically to the surface of packaging of the semiconductor unit 100 with a circuit board or the like. The control terminals 3 are lead out upward from the resin 5. As a consequence, the width W between the ends of the leg portions 1b and 2b of the semiconductor unit 100 is reduced. Therefore, a packaging area for the semiconductor unit 100 is significantly reduced as compared with the construction of FIG. 17 in which power semiconductor elements are arranged on an insulation substrate.

The semiconductor unit 100 is packaged with an undepicted circuit board through the leg portions 1b and 2b and thus, connected to the circuit board electrically and thermally.

The heat generated in the IGBT chip 6 and the FWD chip 9 is conducted through the leg portions 1b and 2b to an undepicted cooling plate or cooling fins. Consequently, a construction of a semiconductor apparatus of the invention does not need a structure disposing cooling bodies on the both surfaces of a semiconductor unit as in the second conventional example. Therefore, the semiconductor apparatus of the invention can be used in variety of power conversion apparatuses ensuring high reliability.

Although the above-described example of semiconductor unit 100 contains two chips of an IGBT chip 6 and a FWD chip 9, the IGBT chip 6 and the FWD chip 9 can be contained in separate respective semiconductor units.

In the semiconductor unit 100 as shown in FIGS. 1(a) through 1 (e), the IGBT chip 6 and the FWD chip 9 are arranged along a direction parallel to the packaging surface of the semiconductor unit 100. In such an arrangement, a distance from the IGBT chip 6 to the cooling surface (the packaging surface of the leg portions 1b, 2b) and a distance from the FWD chip 9 to the cooling surface is approximately equal, allowing uniform cooling.

Though a drawing is omitted, an arrangement is also possible in which the IGBT chip 6 and the FWD chip 9 are disposed along a direction vertical to the packaging surface of the semiconductor unit 100 (the flat surfaces of the chips are also vertical to the packaging surface). In such an arrangement, an area for packaging the semiconductor unit can be further reduced.

Figure 3:
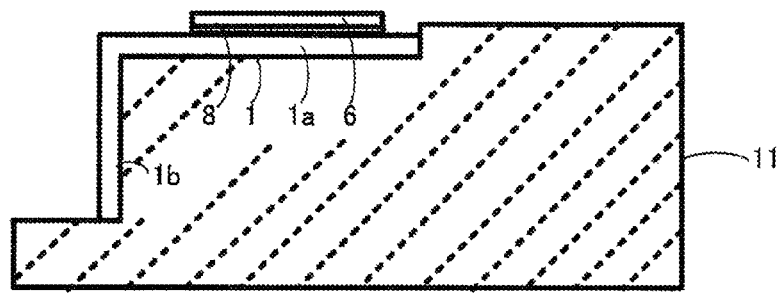
FIGS. 3(a), 3(b), and 3(c) are sectional views of an essential part showing manufacturing steps in the sequence of manufacturing the semiconductor unit 100 of FIGS. 1(a) through 1(e)
Figure 3:
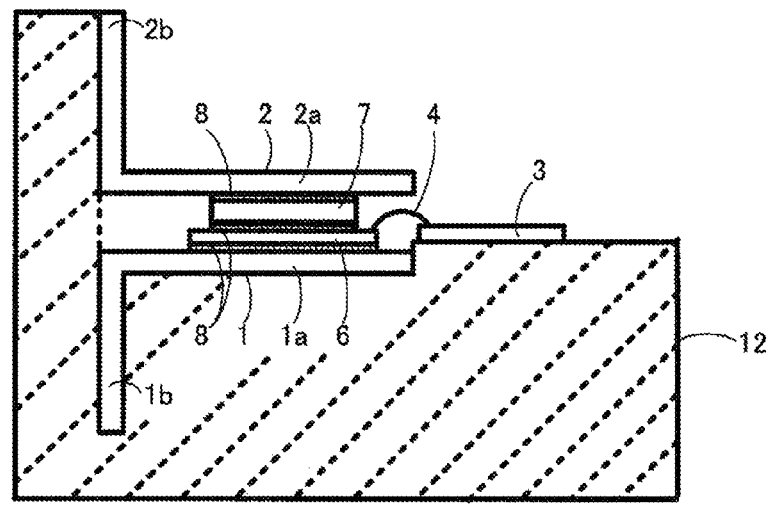
Figure 3:
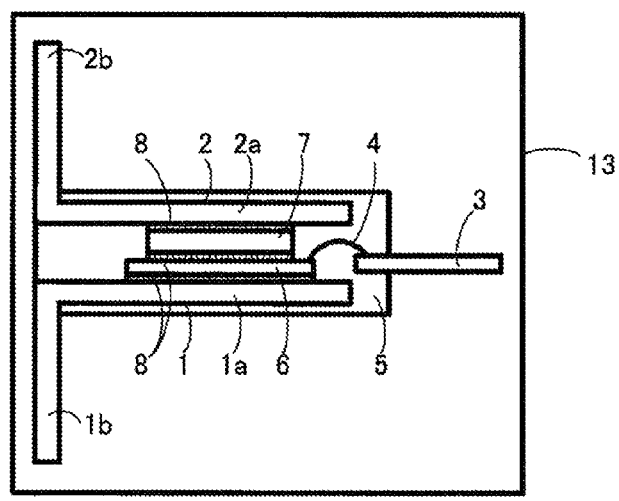

FIGS. 3(a) through 3(c) illustrate a process of manufacturing a semiconductor unit 100 of FIGS. 1(a) through 1(e). FIGS. 3(a) through 3(c) are sectional views of essential parts following the manufacturing sequence.

As shown in FIG. 3(a), an L-shaped electrically conductive plate 1 for collector is placed on a jig 11 with the flat body portion 1a of the conductive plate 1 in a horizontal position. After putting a solder plate on the flat body portion, an IGBT chip 6 and a FWD chip 9 are mounted on the flat body portion is so that the collector electrode of the IGBT chip 6 and the cathode electrode of the FWT chip 9 are in contact with the solder plate. Subsequently, the assembly is transported through a reflow furnace to melt the solder plate. After cooling the assembly, the chips are fixed with the solder 8.

Referring to FIG. 3(b), in the state with the L-shaped electrically conductive plate 1 put on the jig 12, the control terminals 3 are further placed on the jig 12. The control terminals 3 are connected to undepicted control electrodes of the IGBT chip 6 with wires 4.

Then, a solder plate(s) is put on the emitter electrode of the IGBT chip 6 and on the anode electrode of the FWD chip 9, and spacers 7, 10, which are heat spreaders, are placed on the solder plate(s). Subsequently, solder plates are put on the spacers 7 and 10, and a flat body portion 2a of an L-shaped electrically conductive plate 2 for emitter is placed on the solder plates. Here, the bottom surface of the leg portion 1b of the L-shaped electrically conductive plate 1 for collector and the bottom surface of the leg portion 2b of the L-shaped electrically conductive plate 2 for emitter are made in one common plane. This assembly is put into a reflow furnace to melt the solder plates. Taking out from the reflow furnace and cooling down the melt solder plates, the L-shaped electrically conductive plate 1 for collector, the IGBT chip 6, the FWD chip 9, spacers 7, 10, and the L-shaped electrically conductive plate 2 for emitter are fixed with the solder 8.

After soldering with a solder 8, the whole assembled articles are put into a mold 13 as shown in FIG. 3(c) and sealed off with a resin 5 by means of transfer molding, having the leg portions 1b, 2b of the electrically conductive plates 1,2 and the control terminals 3 projecting out of the resin 5. Here, the bottom surface of the resin 5 between the electrically conductive plates 1 and 2 is made in one common plane with the bottom surfaces of the electrically conductive plates 1 and 2. Then, the control terminals 3 and the L-shaped electrically conductive plate 1 are cut off to complete manufacturing steps of the semiconductor unit 100.

In order to obtain the common bottom plane, another process can be taken.

In the step shown in FIG. 3(b), the bottom surface of the leg portion 1b of the electrically conductive plate 1 for collector and the bottom surface of the leg portion 2b of the L-shaped electrically conductive plate 2 for emitter are made in an approximately common plane. Then, in the step shown in FIG. 3(c), after molding with a resin, a grinding process is conducted to create a common plane among the bottom surface of the leg portion 1b of the L-shaped electrically conductive plate 1 for collector, the bottom surface of the leg portion 2b of the L-shaped electrically conductive plate 2 for emitter, and the bottom surface of the resin 5 between the electrically conductive plates 1 and 2.

The control electrodes of the IGBT chip 6 including a gate electrode, an auxiliary emitter electrode, a temperature sensor electrode, and a current detection electrode are connected to the control terminals 3 by wire bonding process. Position adjustment of the plurality of control terminals can be facilitated in the wire bonding process between the control electrodes of the IGBT chip 6 and the control terminals 3 owing to the use of a lead frame having a connection array of tie-bars in the outer lead side, that is, the side of the control terminals 3 projecting out of the resin 5. Separate control terminals 3 are obtained by cutting the tie-bars of the connection array in the outer lead after molding with the resin 5.

Example 2

Figure 4:
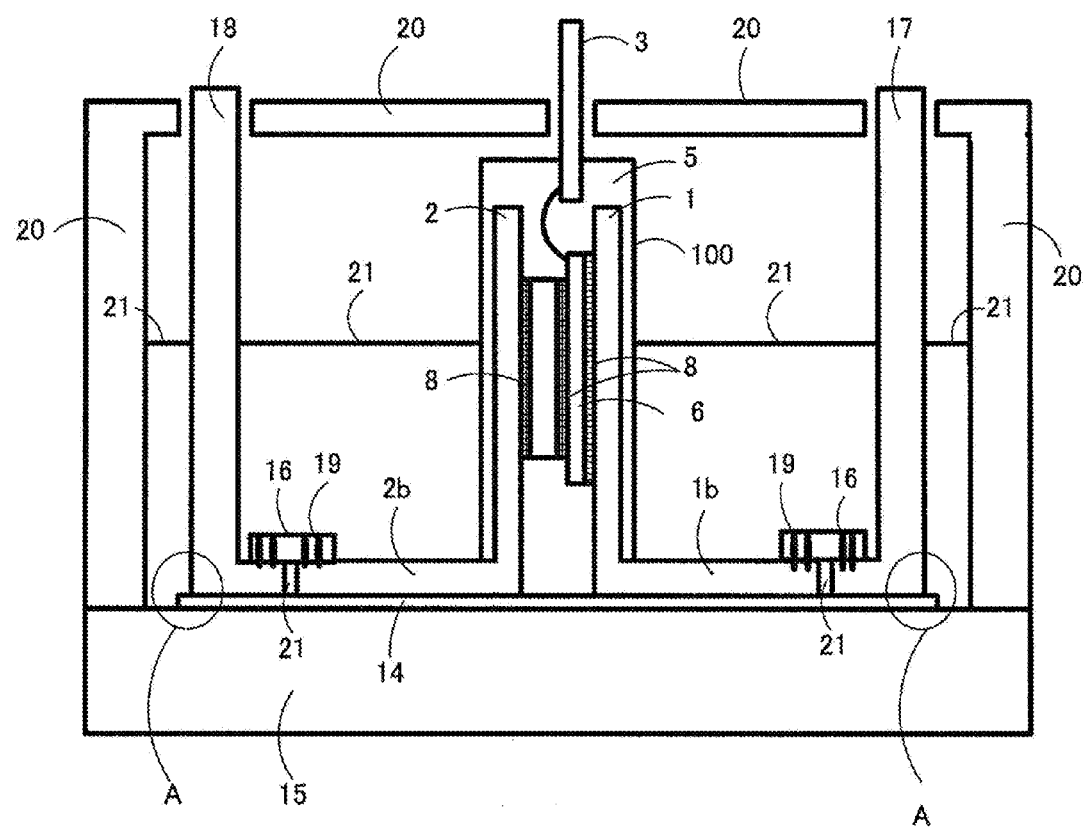
FIG. 4 is a sectional view of an essential part of a semiconductor apparatus 200 of Example 2 according to embodiments of the present invention.

FIG. 4 is a sectional view of an essential part of a semiconductor apparatus of Example 2 according to the present invention. This example contains one unit of the semiconductor unit shown in FIGS. 1(a) through 1(e).

This semiconductor apparatus 200 comprises: a semiconductor unit 100 described previously, a cooling plate 15 fixed through an insulation layer 14 with the bottom surfaces of the leg portions 1b and 2b of the semiconductor unit 100 (the leg portion 1b of the L-shaped electrically conductive plate 1 for collector and the leg portion 2b of the L-shaped electrically conductive plate 2 for emitter); a lead out terminal 17 for collector and a lead out terminal 18 for emitter connected to the leg portions 1b and 2b; a casing 20 containing the semiconductor unit 100 and the lead out terminals 17, 18 and connected to the cooling plate 15; and gel 21 (insulation material, for example, silicone gel) put in the casing 20. The control terminals 3 and the lead out terminals 17, 18 are projecting out of the casing.

In this embodiment example, the leg portion 1b is connected to the lead out terminal 17 for collector through an internal connection conductor 16. The leg portion 2b is similarly connected to the lead out terminal 18 for emitter through the internal connection conductor 16.

The insulation layer 14, a resin insulation sheet of high thermal conductivity in this example, can be replaced by an insulated substrate with an electrically conductive pattern such as a DCB substrate (direct copper bonding substrate).

In the semiconductor apparatus 200, the heat generated in the IGBT chip 6 and the FWD chip 9 (only IGBT 6 can be seen in FIG. 4) is transferred from the surface of the IGBT chip 6 and the surface of the FWD chip 9 to the L-shaped electrically conductive plate 1 for collector and the L-shaped electrically conductive plate 2 for emitter, and then, conducted to the cooling plate 15 through the leg portions 1b and 2b of the respective L-shaped electrically conductive plates. Since the heat generated in the IGBT chip 6 and the FWD chip 9 is removed from the both surfaces of each chip, improved cooling performance is achieved.

Vertical arrangement of the IGBT chip 6 and the FWD chip 9 reduces the area occupied by the cooling plate 15 for cooling the semiconductor unit 100, thus minimizing the semiconductor apparatus 200.

The main electric current flowing in the IGBT chip 6 and the FWD chip 9 runs not through a wire but through the L-shaped electrically conductive plate 1 for collector, the L-shaped electrically conductive plate 2 for emitter, and the internal connection conductor 16. Therefore, a high current can flow in the apparatus.

The IGBT chip 6 and the FWD chip 9 are covered with the resin 5, and this resin 5 is covered with the gel 21. Therefore, the junction surface of the solder 8 is more reliable as compared with the case of the semiconductor unit 100 alone.

Putting in the gel 21, an insulation material, avoids discharge around the part A (in FIG. 4) where a gap is small between the cooling plate 15 and the lead out terminal 17, and between the cooling plate 15 and the lead out terminal 18. Accordingly, the gel 21 can be provided to an amount just covering the part A at the minimum. The gel 21, however, can be more provided as much as filling the whole interior of the casing 20.

Since a variety of tests including a surge test and a short-circuit test can be carried out on the semiconductor unit 100 alone, solely good semiconductor units 100 that have passed through the tests can be used to construct a semiconductor apparatus 200. Therefore, a percentage of good products of an assembled semiconductor apparatus 200 containing the semiconductor unit 100 is enhanced.

Figure 5:
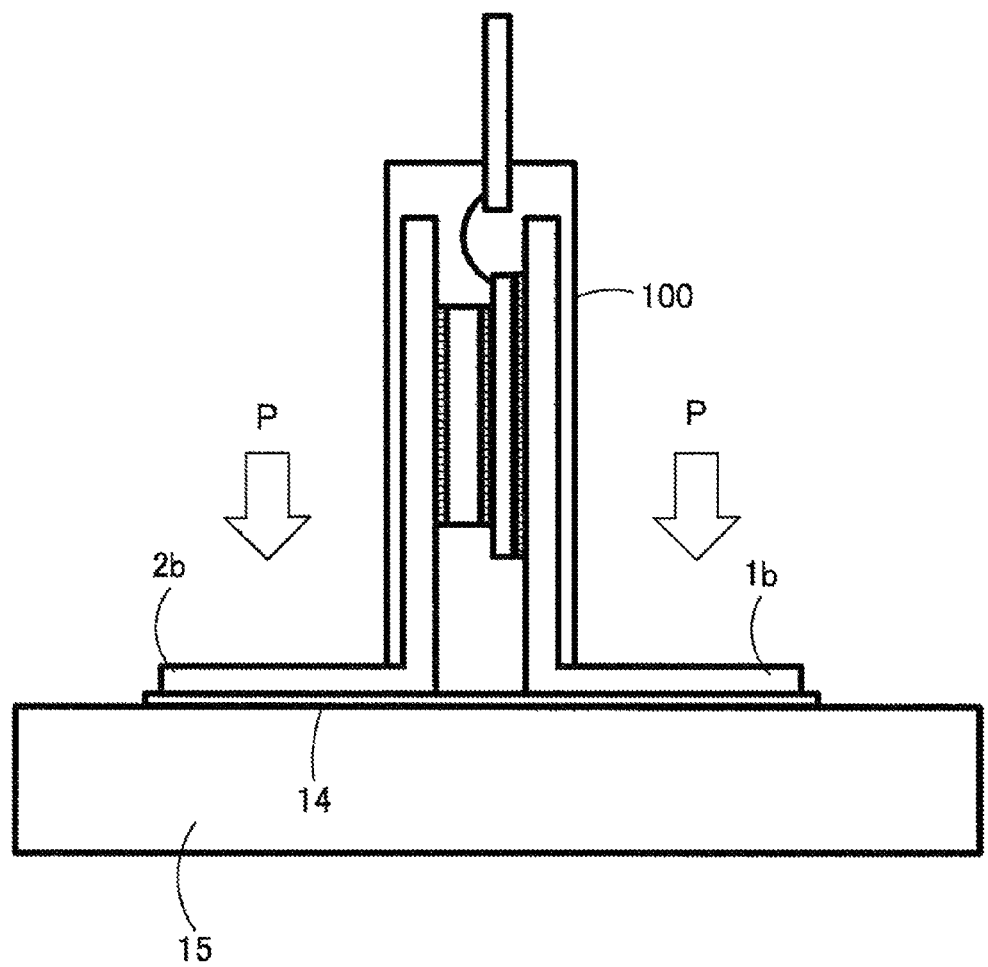
FIG. 5 illustrates a method of fixing the leg portions 1b and 2b of the semiconductor unit 100 onto the cooling plate 15 through an insulation layer 14.

FIG. 5 illustrates a method of fixing the leg portions 1b, 2b of the semiconductor unit 100 to the cooling plate 15 through the insulation layer 14, which is an insulation resin sheet having a high thermal conductively. The insulation layer 14, which is a high thermal conductivity insulation resin sheet, is inserted between the cooling plate 15 and the bottom surfaces of the leg portions 1b, 2b of the semiconductor unit 100. The upper surfaces of the leg portions 1b, 2b are pushed with a specified force as shown by the arrows P in FIG. 5 while being heated. Thus, the semiconductor unit 100 is fixed to the cooling plate 15 with heat and pressure through the high thermal conductivity insulation resin sheet (an insulation layer 14). One sheet of the high thermal conductivity insulation resin sheet is used for one unit of the semiconductor unit 100 in this example. However, one sheet of the insulation resin sheet can be used for a plurality of semiconductor units 100.

Example 3

Figure 6:
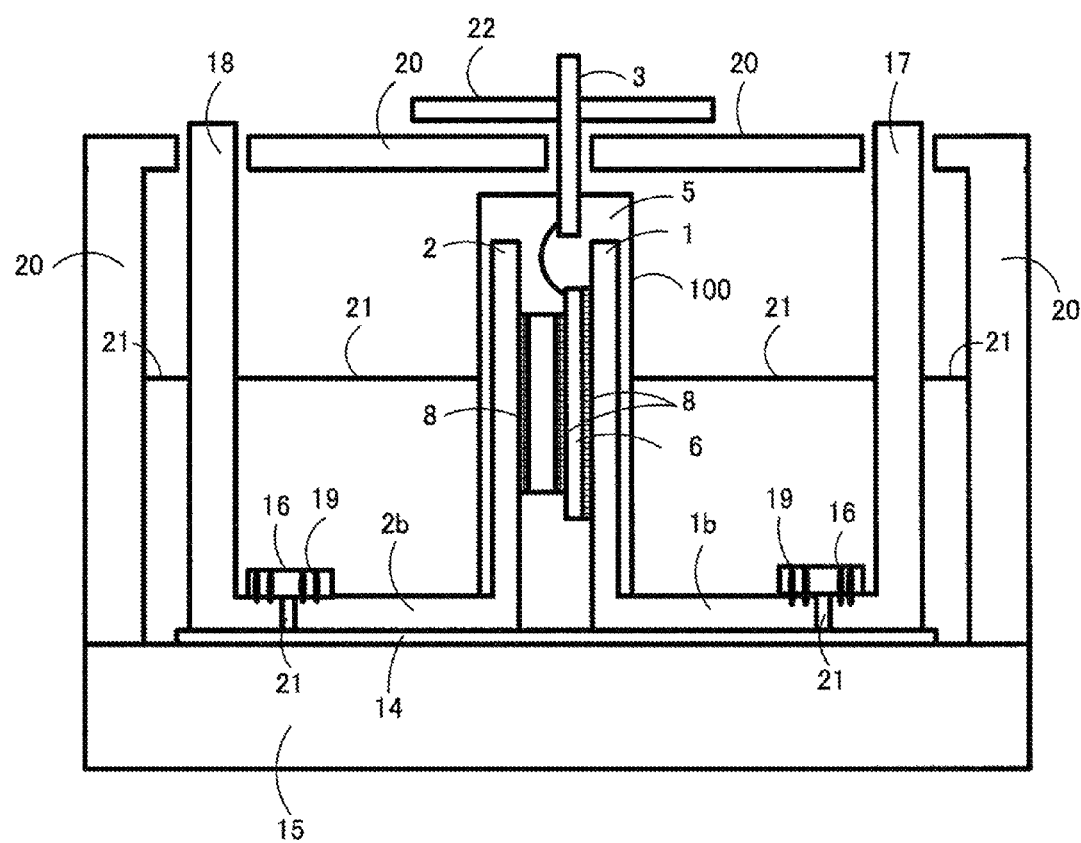
FIG. 6 is a sectional view of an essential part of a semiconductor apparatus 300 of Example 3 according to embodiments of the present invention.

FIG. 6 is a sectional view of an essential part of a semiconductor apparatus of Example 3 according to the invention. This semiconductor apparatus 300 is different from the semiconductor apparatus 200 of FIG. 4 in that a drive circuit board 22 is disposed above the casing 20. The drive circuit board 22 has circuit components mounted thereon to control and protect the IGBT chip 6.

The control terminals 3 lead out from the semiconductor unit 100 are joined to a circuit pattern (not shown in the figure) on the drive circuit board 22.

Example 4

Figure 7:
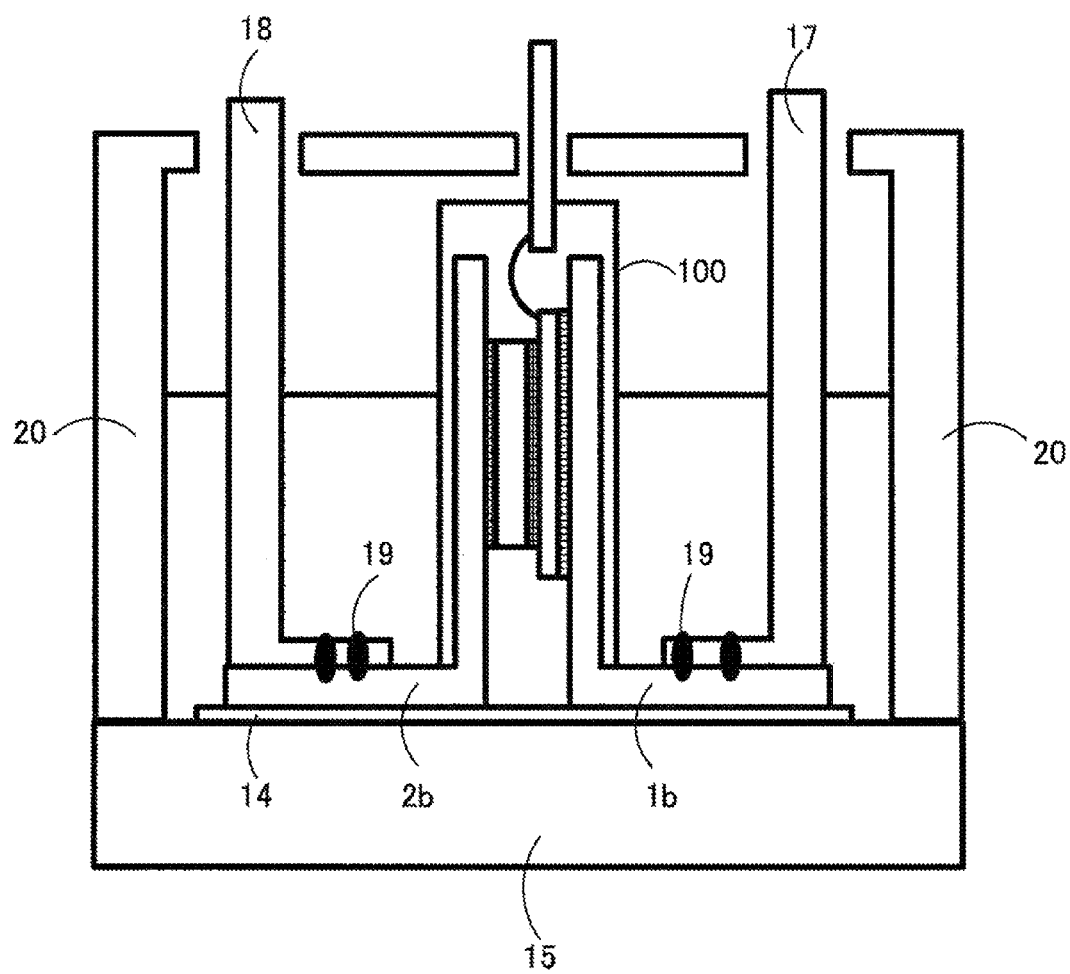
FIG. 7 is a sectional view of an essential part of a semiconductor apparatus 400 of Example 4 according to embodiments of the present invention.

FIG. 7 is a sectional view of an essential part of a semiconductor apparatus of Example 4 according to the invention. This semiconductor apparatus 400 is different from the semiconductor apparatus 200 of FIG. 4 in that the lead out terminals 17 and 18 are joined to the leg portions 1b and 2b by laser welding 19. This means makes the semiconductor apparatus 300 more minimized. In this apparatus too, a drive circuit board can be disposed as in FIG. 6.

Example 5

Figure 8:
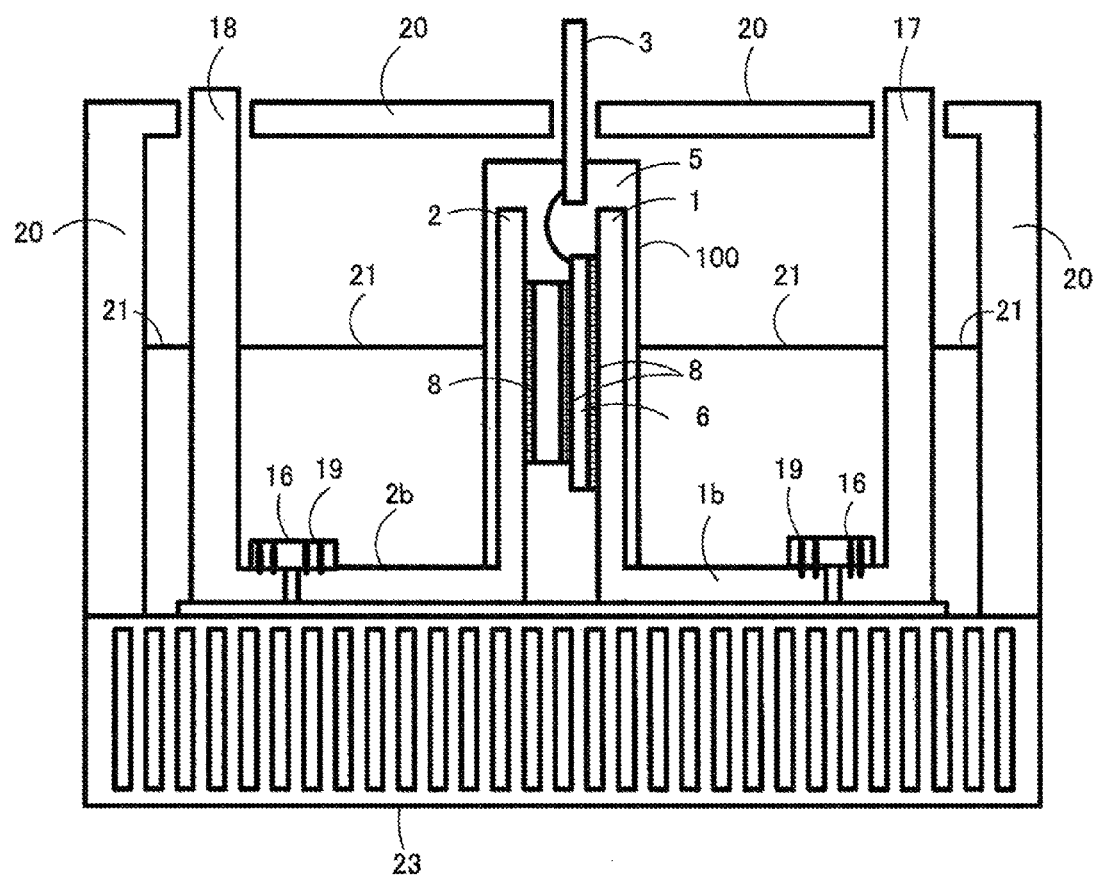
FIG. 8 is a sectional view of an essential part of a semiconductor apparatus 500 of Example 5 according to embodiments of the present invention.

FIG. 8 is a sectional view of an essential part of a semiconductor apparatus of Example 5 according to the invention. This semiconductor apparatus 500 is different from the semiconductor apparatus 200 of FIG. 4 in that a heat sink 23 is used in place of the cooling plate 15. The heat sink 23 can be provided with water-cooled fins or air-cooled fins. The heat sink 23 replaced for the cooling plate 15 achieves enhanced cooling efficiency of the semiconductor apparatus 500.

Example 6

Figure 9:
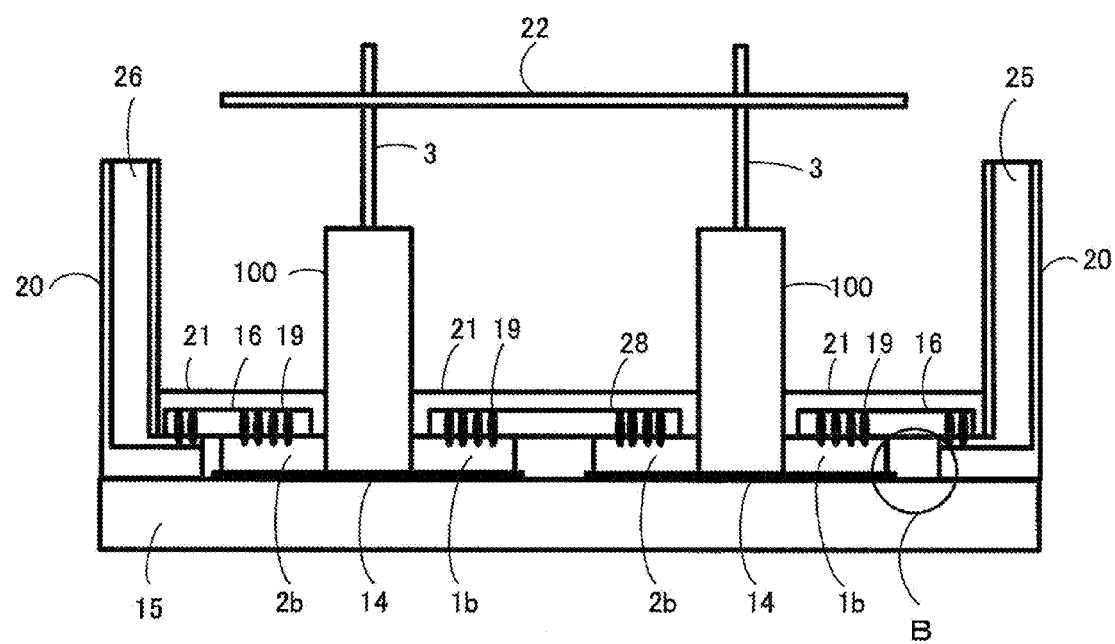
FIG. 9 is a sectional view of an essential part of a semiconductor apparatus 600 of Example 6 according to embodiments of the present invention.

FIG. 9 is a sectional view of an essential part of a semiconductor apparatus of Example 6 according to the invention. This semiconductor apparatus 600 is an example having series-connected two semiconductor units 100.

The semiconductor apparatus 600 comprises: two semiconductor units 100; lead out terminals 25, 26 connected to the leg portions 1b, 2b of the semiconductor unit 100; a cooling plate 15 adhered to the lower surfaces of the leg portions 1b, 2b of the semiconductor unit 100 through an insulation layer 14; a casing 20 connected to the cooling plate 15; gel 21, an insulation material, provided in the casing 20; and a drive circuit board 22 connected to the control terminals 3 above the casing 20. The lead out terminals 25, 26 are disposed through a side wall of the casing 20 in this embodiment example. The lead out terminal 25 is connected to the leg portion 1b of the semiconductor unit 100 through an internal connection conductor 16 that is joined by laser welding 19 to the lead out terminal 25 and the leg portion 1b. The lead out terminal 26 is connected to the leg portion 2b in the similar way. A wiring conductor 28 performs connection between a leg portion of one semiconductor unit 100 and a leg portion of the other semiconductor unit 100, the two semiconductor units being connected in series. The connection between the wiring conductor 28 and the leg portions of the semiconductor units 100 are carried out by laser soldering as well.

In the example shown in FIG. 9, the connection between the leg portion of the semiconductor unit 100 and the lead out terminal is conducted through the internal connection conductor 16. The internal connection conductor 16, however, can be omitted and the lead out terminals 25, 26 can be directly joined to the leg portions of the semiconductor units 100 by laser welding. The direct laser welding can remove the internal connection conductor, and further, can get rid of a laser welding step that would be necessary for connection between the internal connection conductor 16 and the leg portions of the semiconductor units 100.

Moreover, a part of the wiring conductor can be extended to lead out of the casing 20. This means makes it possible to extract the electric potential at the connection point between the series-connected semiconductor units 100 to outside of the casing.

Figure 14:
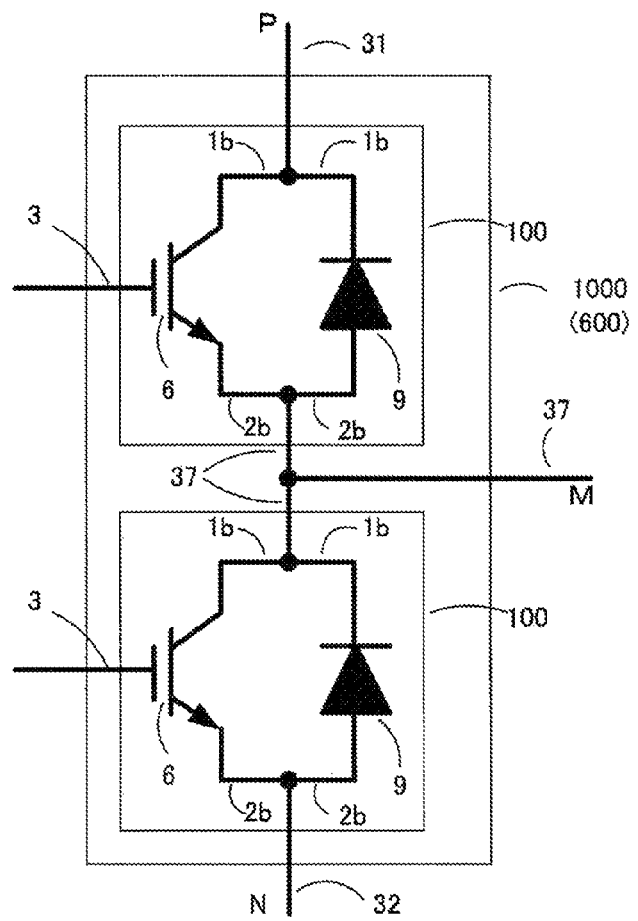
Figure 14:
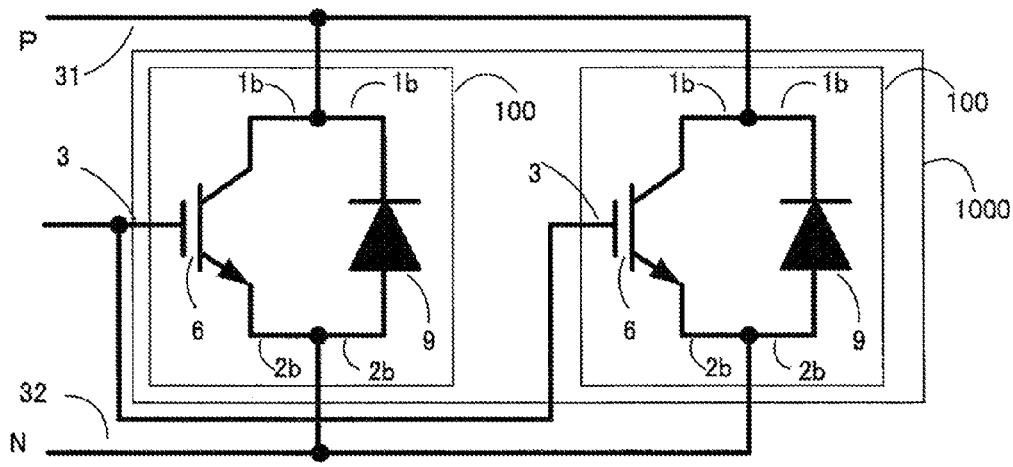

FIG. 14(*a*) is a circuit diagram of an example of such a series connection between the semiconductor units 100. Although the example of FIG. 9 shows the semiconductor units 100 connected in series, the semiconductor units 100 can be connected in parallel as shown in FIG. 14(*b*).

Examples of series connection of semiconductor units 100 as in FIG. 14(*a*) will be further described afterwards.

As described earlier, the insulation layer 14, which is an insulation resin sheet exhibiting high thermal conductivity, works to fix the leg portions 1*b*, 2*b* to the cooling plate 15 with heat and pressure. In place of the insulation layer 14, a DCB substrate (a direct copper bonding substrate) can be used. The leg portions 1*b*, 2*b* are soldered to an electrically conductive pattern on the front surface of the DCB substrate and a copper foil on the rear surface is used to fix to the cooling plate 15.

The gel 21 works to avoid discharge at the position B (in FIG. 9) where a gap between the cooling plate 15 and the leg portions 1*b*, 2*b* is short and a gap between the cooling plate 15 and the lead out terminals 25, 26 is short.

As described above on this example, connection through the internal connection conductor 16 is made between the lead out terminal 25 and the upper surface of the leg portion 1*b* of the semiconductor unit 100, and between the lead out terminal 26 and the upper surface of the leg portion 2*b* of the semiconductor unit 100. Connection between the semiconductor units is made through the wiring conductor. The connection through the internal connection conductors 16 and the connection through the wiring conductor 28 are carried out by means of laser welding 19. This connection process can be carried out by means of ultrasonic joining as well. When the connection is carried out by means of soldering, a solder to be used must have a melting point lower than that of a solder 8 that is used in the semiconductor unit 100.

A construction without the drive circuit board 22 is also possible in this example of semiconductor apparatus. In that case, the control terminals 3 are connected to an undepicted external control circuit with electric wiring.

This semiconductor apparatus 600 is often used provided with a heat sink under the cooling plate 15.

Example 7

Figure 10:
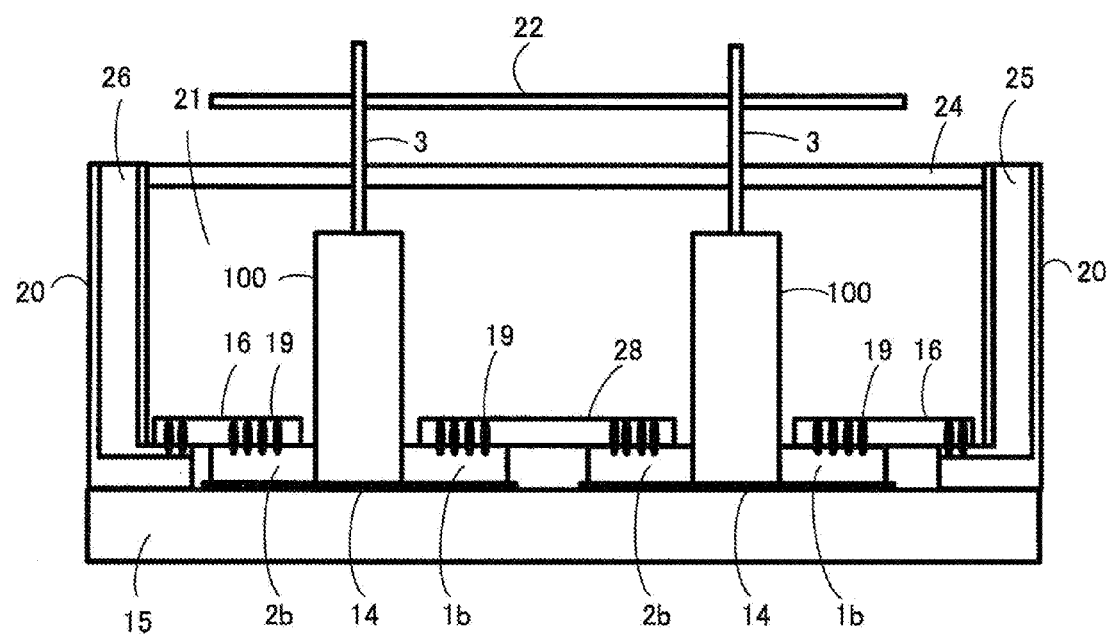
FIG. 10 is a sectional view of an essential part of a semiconductor apparatus 700 of Example 7 according to embodiments of the present invention.

FIG. 10 is a sectional view of an essential part of a semiconductor apparatus of Example 7 according to the invention. This semiconductor apparatus 700 is different from the semiconductor apparatus 600 of FIG. 9 in that a lid 24 is provided on the casing 20 and the interior of the casing 20 is completely filled with a gel 21. Control terminals 3 are projecting out through the lid 24. Provision of the lid 24 firmly fixes the drive circuit board 22.

Example 8

Figure 11:
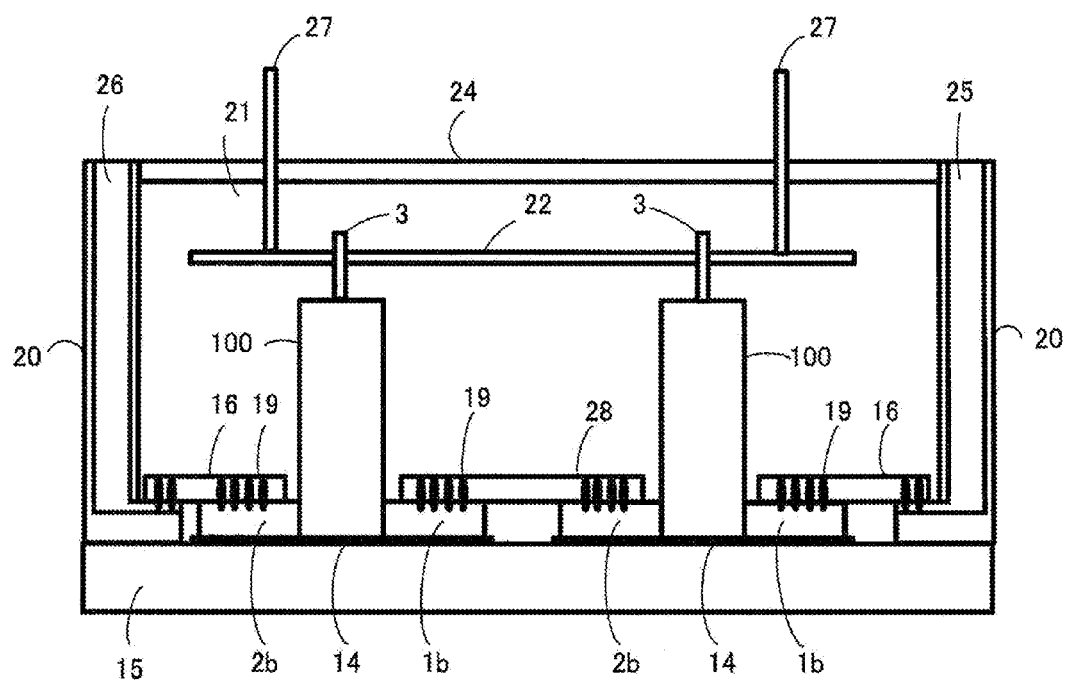
FIG. 11 is a sectional view of an essential part of a semiconductor apparatus 800 of Example 8 according to embodiments of the present invention.

FIG. 11 is a sectional view of an essential part of a semiconductor apparatus of Example 8 according to the invention. This semiconductor apparatus 800 is different from the semiconductor apparatus 700 of FIG. 10 in that the drive circuit board 22 is contained within the casing 20. The drive circuit board 22 is provided with externally connecting pins 27. The control terminals 3 of the semiconductor unit 100 are connected to the drive circuit board inside the casing 20. The externally connecting pins 27 provided on the drive circuit board 22 are projecting out through the lid 24 and connected to undepicted external wirings.

Since the drive circuit board 22 is embedded in the gel 21, any foreign matter is avoided to be attached on the drive circuit board 22, thus improving reliability of the apparatus.

When the drive circuit board 22 is fixed to the casing 20 in the casing 20 (though not depicted in FIG. 11), if any stress is subjected to the externally connecting pins 27 that is connected to the external wiring, the stress is not transferred to the control terminals 3 of the semiconductor unit 100.

Example 9

Figure 12:
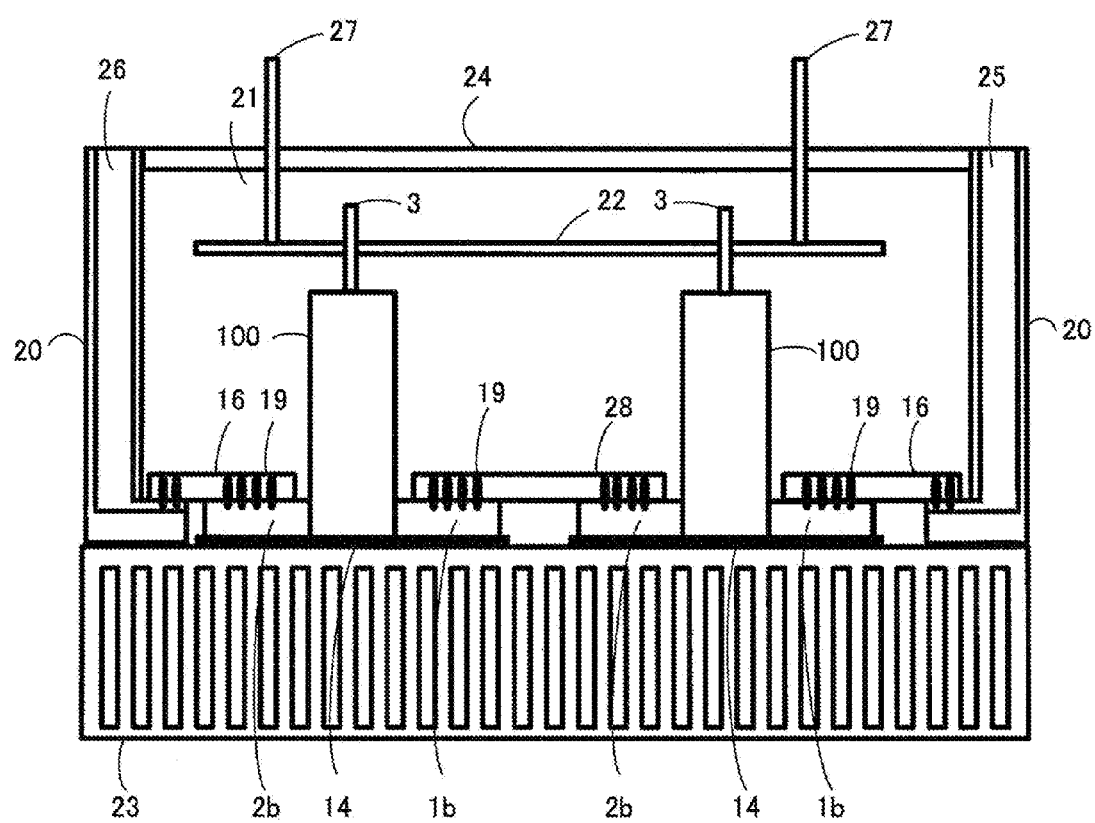
FIG. 12 is a sectional view of an essential part of a semiconductor apparatus 900 of Example 9 according to embodiments of the present invention.

FIG. 12 is a sectional view of an essential part of a semiconductor apparatus of Example 9 according to the invention. This semiconductor apparatus 900 is different from the semiconductor apparatus 800 of FIG. 11 in that a heat sink 23 is used in place of the cooling plate 15. The heat sink 23 shown here is water cooled fins. Air cooled fins can be used as well. This construction improves cooling efficiency.

Example 10

Figure 13:
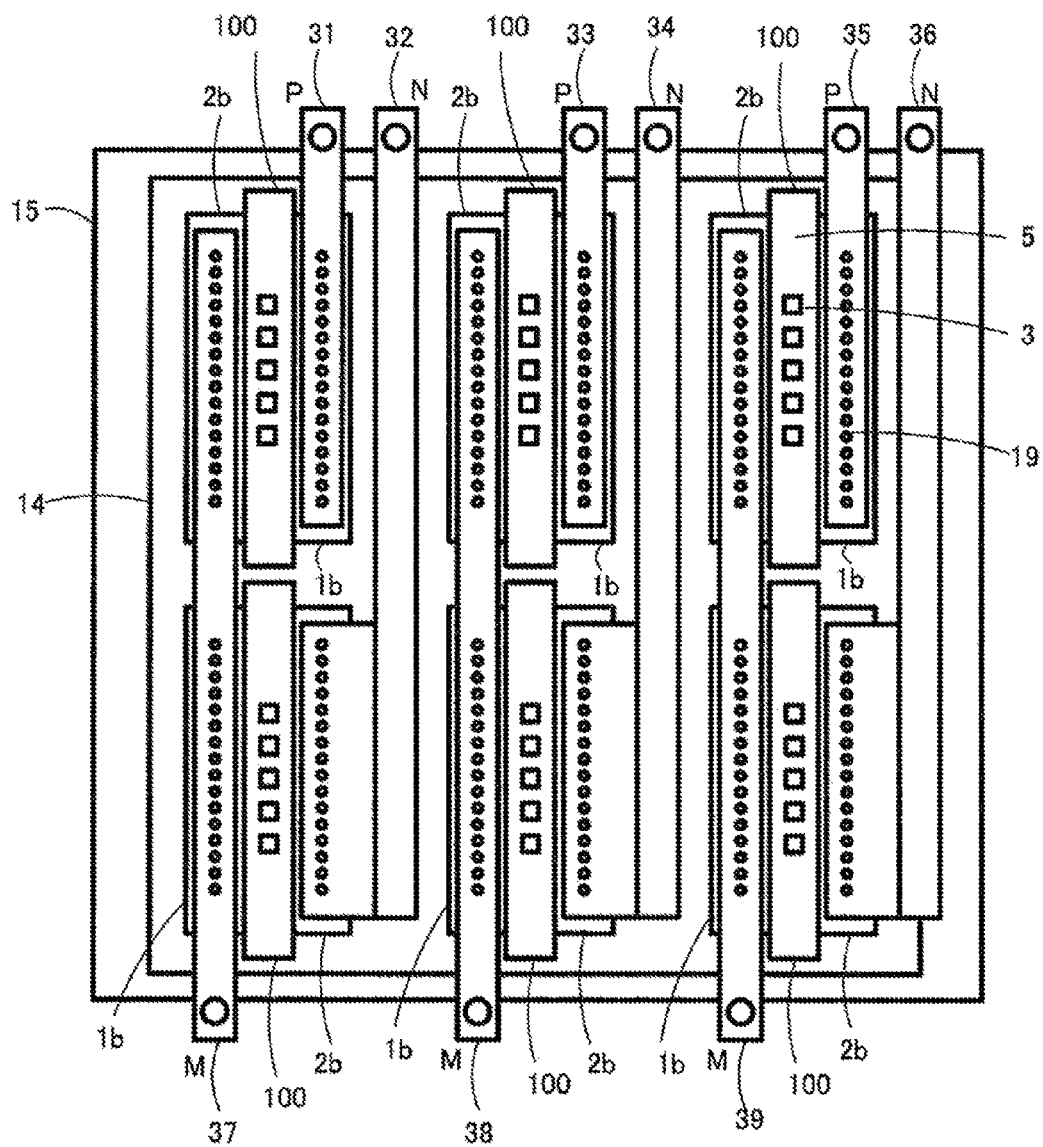
FIG. 13 is a sectional view of an essential part of a semiconductor apparatus 1000 of Example 10 according to embodiments of the present invention.

FIG. 13 is a sectional view of an essential part of a semiconductor apparatus of Example 10 according to the invention. This semiconductor apparatus 1000 is a semiconductor module constructing a three phase inverter, a type of power conversion apparatus. The semiconductor module assembles six semiconductor units 100 including IGBT chips 6 and FWD chips 9. FIG. 14(*a*) is a circuit diagram of one phase (or one arm) of the three phase inverter of FIG. 13.

This semiconductor apparatus 1000 comprises: six semiconductor units 100; wiring bars 31, 33, 35 that are connecting to the leg portions 1*b* of the semiconductor units 100; wiring bars 37, 38, 39 that are wiring conductors each series-connecting the leg portion 1*b* of a semiconductor unit 100 to the leg portion 2*b* of another semiconductor unit 100; wiring bars 32, 34, 36 that are lead out terminals connecting to leg portions 2*b* of the semiconductor units 100; a cooling plate 15 to which the leg portions 1*b*, 2*b* of the semiconductor units 100 are fixed through the insulation layer 14 with heat and pressure; a casing (undepicted; see the casing 20 in FIG. 11, for example) containing the insulation layer 14 and the semiconductor units 100 and fixed to the cooling plate 15; and gel (undepicted; see the gel 21 in FIG. 11, for example) filling the interior of the casing.

The wiring bars 31, 33, 35 are P terminals (corresponding to '+' terminals), which are lead out terminals, of the three phase inverter; the wiring bars 32, 34, 36 are N terminals (corresponding to '−' terminals), which are lead out terminals, of the three phase inverter; and the wiring bars 37, 38, 39 are wiring conductors for connection between the semiconductor units 100 and partly extended to become M terminals (corresponding to U-phase, V-phase, and W-phase) of the three phase inverter.

This semiconductor apparatus 1000 is generally used with an undepicted heat sink provided under the cooling plate 15.

In the example of FIG. 13, the wiring bars 31 through 38 are directly lead out from an undepicted casing. Those wiring bars 31 through 38 are directly joined to the leg portions of the semiconductor units 100 by laser welding. Therefore, the internal connection conductors as shown in FIG. 9 can be eliminated.

The cooling plate 15 in FIG. 13 can be replaced by a heat sink (see the heat sink 23 in FIG. 12, for example). Since the cooling plate 15 is eliminated in that case, cooling performance can be improved.

An non-depicted drive circuit board (see the drive circuit board 22 in FIG. 11, for example) can be provided above the semiconductor units 100. In that case, the control terminals 3 are connected to an external control circuit with electric wirings.

Since this semiconductor apparatus 1000 does not have two cooling bodies on both surfaces of the semiconductor unit 100 but has only one heat sink under the semiconductor unit 100, a semiconductor apparatus corresponding to the one disclosed in Patent Document 2 can be reduced in its size.

Example 11

Figure 15:
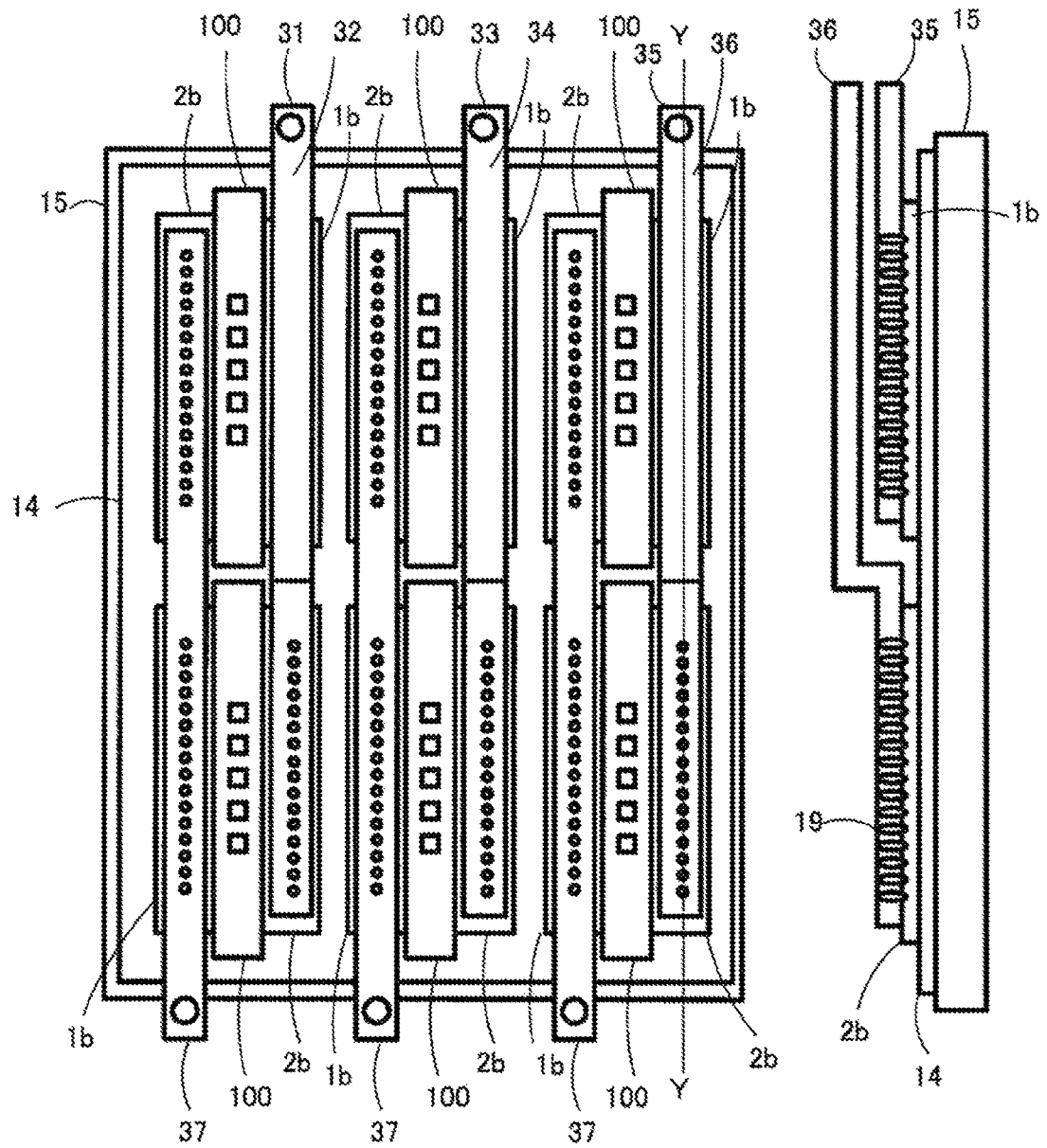

FIGS. 15(a) and 15(b) show a construction of a semiconductor apparatus of Example 11 according to the present invention, in which FIG. 15(a) is a plan view of an essential part, and FIG. 15(b) is a sectional view of the essential part cut along the line Y-Y in FIG. 15(a).

This semiconductor apparatus 1100 is different from the semiconductor apparatus 1000 of FIG. 13 in that the wiring bars connecting to the semiconductor units 100 are arranged separating vertically and in three-dimensional arrangement. This configuration reduces the planar area occupied by the wiring bars and thus makes the semiconductor apparatus smaller in its size. In this construction, having the wiring bars at different height, the lower wiring bar is first laser welded, and then, higher wiring bar is laser welded, thus, two times of laser welding processes are conducted.

Example 12

Figure 16:
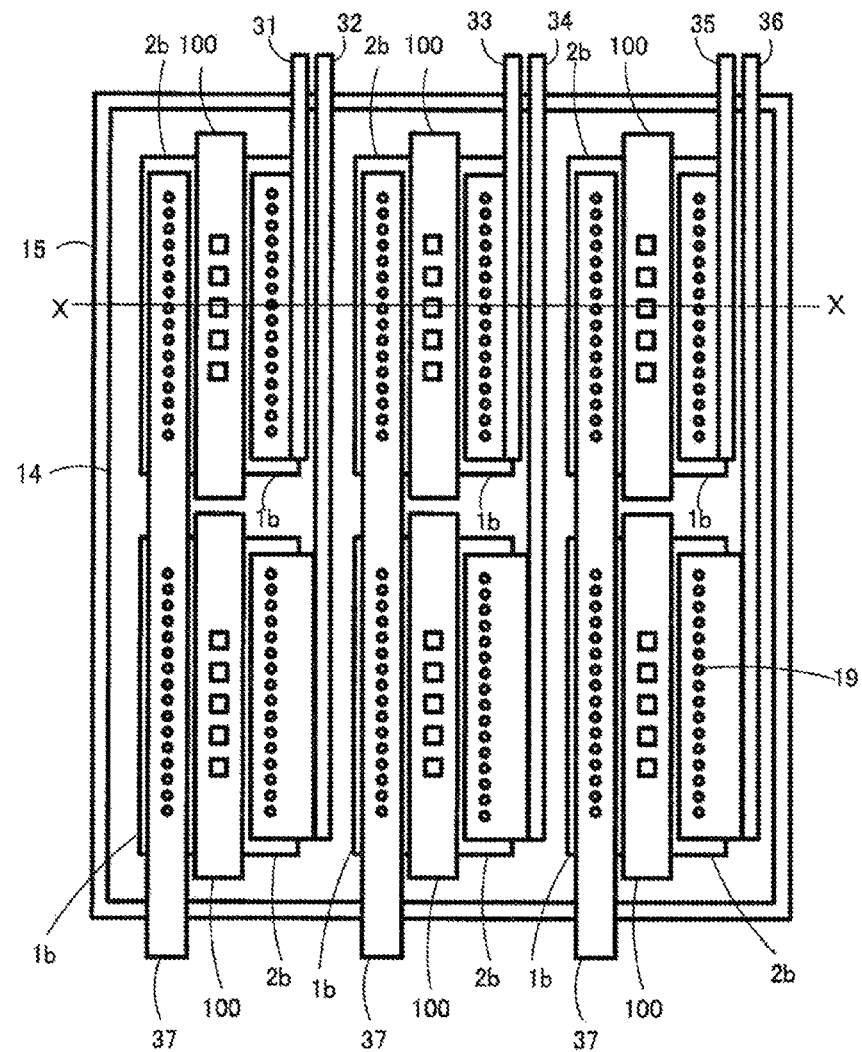
Figure 16:
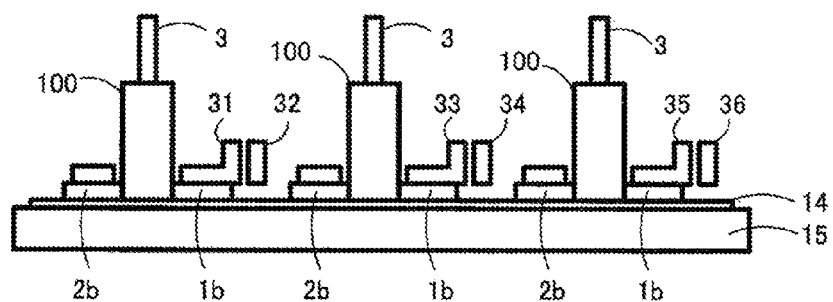

FIGS. 16(a) and 16(b) show a construction of a semiconductor apparatus of Example 12 according to the present invention, in which FIG. 16(a) is a plan view of an essential part, and FIG. 16(b) is a sectional view of the essential part cut along the line X-X in FIG. 16(a).

This semiconductor apparatus 1200 is different from the semiconductor apparatus 1100 of FIGS. 15(a) and 15(b) in that the wiring bars 31 through 36 connecting to the semiconductor unit 100 are arranged bent vertically. In this construction too, the planar area occupied by the wiring bars 31 through 36 is small and thus, the semiconductor apparatus 1200 is reduced in its size.

The vertical levels of the surfaces of welding the wiring bars 31 through 36 are the same and thus, the process of the laser welding 19 can be only once.

Figure 19:
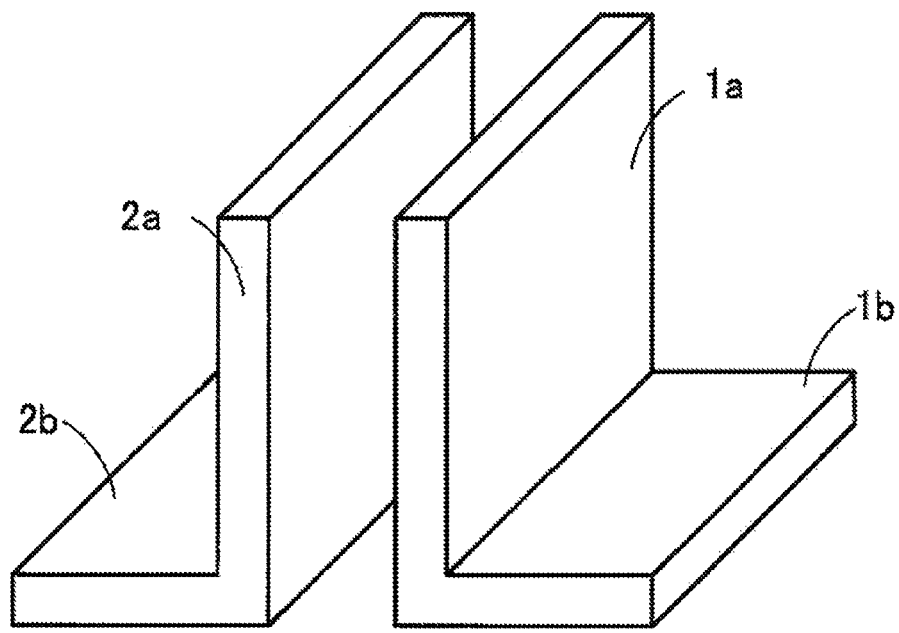
Figure 19:
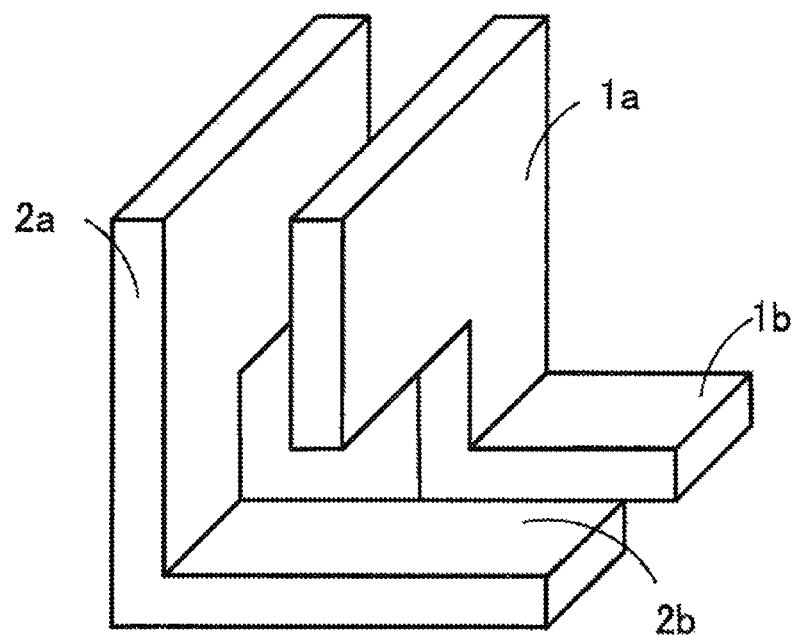

FIGS. 19(a) and 19(b) are perspective views of electrically conductive plates showing examples of leg portions leading out from the semiconductor unit. Structures except for the electrically conductive plates are omitted in the figures.

In the examples described thus far, the leg portion 1b of an L-shaped electrically conductive plate 1 for collector and the leg portion 2b of an L-shaped electrically conductive plate 2 for emitter are extending towards opposite directions as shown in FIG. 19(a). An electrically conductive plate having a shape as shown in FIG. 19(a) can be manufactured at a low cost owing to a simple configuration thereof and a packaging process subsequent to production of the semiconductor unit can be carried out stably.

FIG. 19(b) shows a variation of the present invention with the leg portions of the electrically conductive plates that are extending to the same direction. The electrically conductive plates of this example also have a sectional configuration of the letter L. The flat body portion 1a of the electrically conductive plate 1 has a cut for extracting the leg portion 2b of the electrically conductive plate 2. Thus, the leg portion 2b of the electrically conductive plate 2 is extending towards the same direction as the leg portion 1b of the electrically conductive plate 1. A projected planar area required for packaging the semiconductor unit is substantially reduced by the configuration of the leg portions 1b and 2b extending towards the same direction. However, the structure of FIG. 19(b), due to a smaller area under the leg portions 1b, 2b as compared with the structure of FIG. 19(a), provides a smaller area for thermal contact with the cooling plate through an undepicted insulation layer. Accordingly, the structure of FIG. 19(b) is suitable for the cases in which a small amount of heat is generated in the semiconductor chip joined to the electrically conductive plates 1, 2 or an area of packaging the semiconductor unit is to be greatly reduced.

This application is based on, and claims priority to, Japanese Patent Application No. 2010-113183, filed on May 17, 2010. The disclosure of the priority application, in its entirety, including the drawings, claims, and the specification thereof, is incorporated herein by reference.

What is claimed is:

1. A semiconductor unit comprising:
   electrically conductive plates, each of the plates being in the shape of the letter L, having a flat body portion and a leg portion perpendicular to the flat body portion;
   a pair of a semiconductor chip and a spacer that are laminated and fixed with each other, the pair being sandwiched by a flat body portion of each of two of the electrically conductive plates, the electrically conductive plates being disposed opposing each other;
   control terminals, one side end of one or more of the control terminals being connected to control electrodes of the semiconductor chip; and
   resin that seals off the flat body portions of the electrically conductive plates, the spacer, the semiconductor chip, and the one side ends of the control terminals;
   wherein ends of the leg portions of the electrically conductive plates and ends of the control terminals opposite the one side ends are projecting out of the resin, and
   wherein the semiconductor chip is an IGBT chip, and a FWD chip is connected in anti-parallel to the IGBT chip.

2. A semiconductor apparatus comprising:
   the semiconductor unit of claim 1;
   lead out terminals each connected to a leg portion of the semiconductor unit of claim 1 through an internal connection conductor;
   a cooling plate to which lower surfaces of the leg portions of the semiconductor unit of claim 1 or lower surfaces of the lead out terminals are fixed interposing an insulation layer;
   a casing fixed to the cooling plate and containing the semiconductor unit of claim 1 and the lead out terminals, ends of the lead out terminals and ends of the control terminals being projecting out of the casing; and
   insulation material in the casing.

3. The semiconductor apparatus according to claim 2, further comprising a drive circuit board disposed above the casing and connected to the control terminals of the semiconductor unit of claim 1.

4. The semiconductor apparatus according to claim 2, wherein the insulation material is gel.

5. The semiconductor apparatus according to claim 2, wherein the lead out terminals are fixed to the leg portion of the semiconductor unit by means of laser welding.

6. A semiconductor apparatus comprising:
   a plurality of semiconductor units, each of the plurality of semiconductor units configured as the semiconductor unit of claim 1;
   a wiring conductor connecting the leg portions of the plurality of semiconductor units;
   lead out terminals each connected to the leg portion of the plurality of semiconductor units;
   a cooling plate to which at least one of a lower surface of the leg portion, a lower surface of the wiring conductor, and a lower surface of the lead out terminal are fixed interposing an insulation layer;

a casing fixed to the cooling plate and containing the plurality of semiconductor units, the wiring conductors, and the lead out terminals, ends of the lead out terminals and ends of the control terminals being projecting out of the casing; and insulation material in the casing, wherein a part of the wiring conductor extends to project out and lead out from the casing.

7. The semiconductor apparatus according to claim 6, wherein each of the lead out terminals is connected to a leg portion of one of the plurality of semiconductor units or the wiring conductor through an internal connection conductor.

8. The semiconductor apparatus according to claim 6, wherein the lead out terminals are at least one of a P terminal, an N terminal, and an M terminal that are a component of an inverter.

9. The semiconductor apparatus according to claim 6, wherein the lead out terminals are disposed separating vertically in the casing.

10. The semiconductor apparatus according to claim 6, wherein the leg portions of one of the plurality of semiconductor units are fixed to the lead out terminal and the wiring conductor by means of laser welding.

11. A semiconductor apparatus comprising:
a plurality of the semiconductor units, each of the plurality of semiconductor units comprising:
electrically conductive plates, each of the plates being in the shape of the letter L, having a flat body portion and a leg portion perpendicular to the flat body portion;
a pair of a semiconductor chip and a spacer that are laminated and fixed with each other, the pair being sandwiched by a flat body portion of each of two of the electrically conductive plates, the electrically conductive plates being disposed opposing with each other;
control terminals, one side end of one or more of the control terminals being connected to control electrodes of the semiconductor chip; and
resin that seals off the flat body portions of the electrically conductive plates, the spacer, the semiconductor chip, and the one side ends of the control terminals;
wherein the leg portions of the electrically conductive plates and ends of the control terminals opposite the one side ends are projecting out of the resin;
the semiconductor apparatus further comprising:
a wiring conductor connecting the leg portions of a plurality of the semiconductor units;
lead out terminals each connected to a leg portion of the plurality of the semiconductor units;
a cooling plate to which at least one of a lower surface of the leg portion, a lower surface of the wiring conductor, and a lower surface of the lead out terminal are fixed interposing an insulation layer;
a casing fixed to the cooling plate and containing the semiconductor unit, the wiring conductors, and the lead out terminals, ends of the lead out terminals and ends of the control terminals being projecting out of the casing; and
insulation material in the casing;
a lid covering the casing at the top thereof;
a drive circuit board that is disposed inside the casing, immersed in the insulation material, and connected to the control terminals of the semiconductor unit; and
control conductors that are fixed to the drive circuit board and projecting out through the lid.

\* \* \* \* \*